(12) United States Patent
Miura

(10) Patent No.: US 8,309,862 B2
(45) Date of Patent: Nov. 13, 2012

(54) DUAL INLINE LEAD-TYPE ELECTRONIC-PART-MOUNTED PRINTED CIRCUIT BOARD, METHOD OF SOLDERING DUAL INLINE LEAD-TYPE ELECTRONIC PART, PRINTED CIRCUIT BOARD AND AIR-CONDITIONER

(75) Inventor: Tsuyoshi Miura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 424 days.

(21) Appl. No.: 12/499,830

(22) Filed: Jul. 9, 2009

(65) Prior Publication Data

US 2010/0193233 A1    Aug. 5, 2010

(30) Foreign Application Priority Data

Jan. 30, 2009    (JP) .................. 2009-019388

(51) Int. Cl.
   *H05K 1/11*    (2006.01)
   *H05K 7/00*    (2006.01)
   *H05K 1/14*    (2006.01)
(52) U.S. Cl. .......... 174/261; 361/760; 361/736
(58) Field of Classification Search .......... 174/261; 361/760
   See application file for complete search history.

(56) References Cited

U.S. PATENT DOCUMENTS

2007/0034403 A1*  2/2007  Miura .......... 174/260
2007/0051778 A1*  3/2007  Miura .......... 228/101

FOREIGN PATENT DOCUMENTS

| CN | 1705428 | 12/2005 |
|---|---|---|
| EP | 1 753 276 | 2/2007 |
| EP | 1 763 296 | 3/2007 |
| JP | 61-140193 A | 6/1986 |
| JP | 63-213994 A | 9/1988 |
| JP | 4-23160 U | 2/1992 |
| JP | 2000-315852 A | 11/2000 |
| JP | 2002-280717 A | 9/2002 |
| JP | 2005-347529 A | 12/2005 |
| JP | 2007-048874 A | 2/2007 |
| JP | 2007-073747 A | 3/2007 |

OTHER PUBLICATIONS

European Search Report issued in corresponding Application No. 09009376.6-1232 dated Feb. 4, 2010.
Office Action issued by the Japanese Patent Office on Sep. 11, 2012 in corresponding Japanese Patent Application No. 2009-19388, and a computer-generated translation thereof.

* cited by examiner

*Primary Examiner* — Timothy Thompson
*Assistant Examiner* — Nathan Milakovich
(74) *Attorney, Agent, or Firm* — Buchanan Ingersoll & Rooney PC

(57) ABSTRACT

A printed circuit board 1 is provided, which includes: soldering lands for connecting respective leads of a dual inline lead-type electronic part 2 by jet-type soldering; and a solder-drawing land 4 for absorbing excessive solder during soldering, which is arranged at a position behind the rearmost soldering lands 3*h* in the traveling direction of jet-type soldering. The solder-drawing land has a square outer shape and includes a slit 4*a* in a bent shape therein. One corner of the square is located near the rearmost soldering lands 3*h* and arranged between the leads, while a bent portion of the slit is arranged near the one corner.

5 Claims, 4 Drawing Sheets

TRAVELING DIRECTION OF
JET-TYPE SOLDERING

TRAVELING DIRECTION OF
NOZZLE TYPE-SOLDERING

3: SOLDERING LAND GROUP
4: REAR SOLDER DRAWING LAND

DUAL INLINE LEAD-TYPE ELECTRONIC-PART-MOUNTED PRINTED CIRCUIT BOARD, METHOD OF SOLDERING DUAL INLINE LEAD-TYPE ELECTRONIC PART, PRINTED CIRCUIT BOARD AND AIR-CONDITIONER

BACKGROUND OF THE INVENTION

1. Field of the Invention

The present invention relates to a printed circuit board on which a dual inline lead-type electronic part having a plurality of leads is mounted by jet-type soldering using a jet-type solder bath.

2. Description of the Related Art

In general, for a printed circuit board, it has been increasingly required to improve a packing density of parts thereon or miniaturize parts thereon. Therefore, dual inline lead-type electronic parts with narrow pitches or the like have been required to be mounted on the board. On the other hand, practical application of lead-free solder considering environmental problems becomes urgent necessity. However, the lead-free solder is inferior in solderability in comparison with leaded eutectic solder which has been conventionally used. Thus, short circuit at soldered portions between lead terminals of the dual inline lead-type electronic part or the like (referred to as solder bridge) has been occurred.

In order to prevent generation of a solder bridge, conventionally, printed circuit boards using lead-free solder have been made by a method of installing a rectangular-shaped solder-drawing land having a lattice surface and a smooth surface, on the rear side of a soldering land at the rearmost end of a dual inline lead-type electronic part, and allowing the solder-drawing land to absorb excessive solder (see, for example, Japanese Unexamined Patent Application Publication No. 2005-347529 (pp. 4 to pp. 6, FIG. 2 to FIG. 4)).

In addition, as another conventional example, printed circuit boards using lead-free solder have been made by a method of installing a square-shaped solder drawing land having a cross-shaped slit on the rear side of a soldering land at the rearmost end of a dual inline lead-type electronic part and allowing the solder-drawing land to absorb excessive solder (see, for example, Japanese Unexamined Patent Application Publication No. 2007-73747 (pp. 4 to pp. 7, FIGS. 2 and 3)).

As another conventional example, printed circuit boards using lead-free solder have been made by a method of installing a triangle-shaped solder-drawing land on the rear side of a soldering land at the rearmost end of a lead-type electronic part and allowing the solder-drawing land to absorb excessive solder (see, for example, Japanese Unexamined Patent Application Publication No. 2002-280717 (pp. 3 to pp. 4, FIG. 4 to FIG. 6)).

PRIOR ARTS

Patent Documents

SUMMARY OF THE INVENTION

The printed circuit board mounted with a dual inline lead-type electronic part in the related art as described above requires precise control of a manufacturing process in order to maintain a stable and high-quality soldering which may not cause solder bridges or solder chips between the leads of dual inline lead-type electronic parts. However, the narrower the pitch of the leads in the longitudinal direction becomes or the narrower the distance between dual lines becomes, the more defects of soldering tends to occur, when lead-free solder with low solderability is used, Thus, it is difficult to maintain accuracy of soldering.

In the above first patent document, furthermore, the rectangular solder-drawing land has a complicated shape provided with the lattice surface and smooth surface, and hence causes an increase in production cost. In addition, there is a need of increasing the size of the lattice surface and intervals of the lattice space to cause a sufficient solder-drawing effect, particularly a sufficient effect of suppressing the force of solder to be backed during soldering (i.e., the force of solder once drawn in the solder-drawing land to move back to the rearmost portion of the soldering land by the action of surface interfacial tension). In the above second patent document, the square solder-drawing land has a cross-shaped slit in the inside thereof. However, the cross-shaped slit does not substantially suppress the force of solder to be backed during soldering. Furthermore, in the case of the triangular solder-drawing land as illustrated in the above third patent document, it is more difficult to suppress the force of solder to be backed during soldering.

The present invention has been made in view of the above facts. Accordingly, it is an object of the present invention to provide a printed circuit board having a simplified geometry of a solder-drawing land. That is, when a dual inline lead-type electronic part is soldered to the board by jet-type soldering, such a simplified geometry of a solder-drawing land improves an effect of solder drawing and reliably prevents the generation of solder bridges and solder chips while preventing the occurrence of defects of soldering, particularly even in the case of soldering the dual inline lead-type electronic part with a narrow pitch between leads.

A printed circuit board mounted with a dual inline lead-type electronic-part according to the present invention includes: soldering lands for connecting respective leads of the dual inline lead-type electronic part by jet-type soldering; and a solder-drawing land for absorbing excessive solder during soldering, which is arranged at a position behind rearmost soldering lands in a travelling direction of jet-type soldering. The solder-drawing land has a square outside shape and an inside slit in a bent shape, and one corner of the square shape is located near the rearmost soldering lands and arranged between the leads, while a bent portion of the slit is arranged near the one corner.

Since the printed circuit board mounted with a dual inline lead-type electronic-part according to the present invention is constructed as described above, the shape of a solder-drawing land is simplified to improve an effect of solder-drawing. Specifically, the surface/interfacial tension of the solder once drawn on the solder-drawing land can be dispersed by the slit. Therefore, there is an advantage of substantially preventing the generation of solder bridges and solder chips.

DESCRIPTION OF THE PREFERRED EMBODIMENTS

Embodiment 1

Referring now to FIG. 1 to FIG. 4, a printed circuit board mounted with a dual inline lead-type electronic-part according to Embodiment 1 of the invention will be described.

Figure 1:
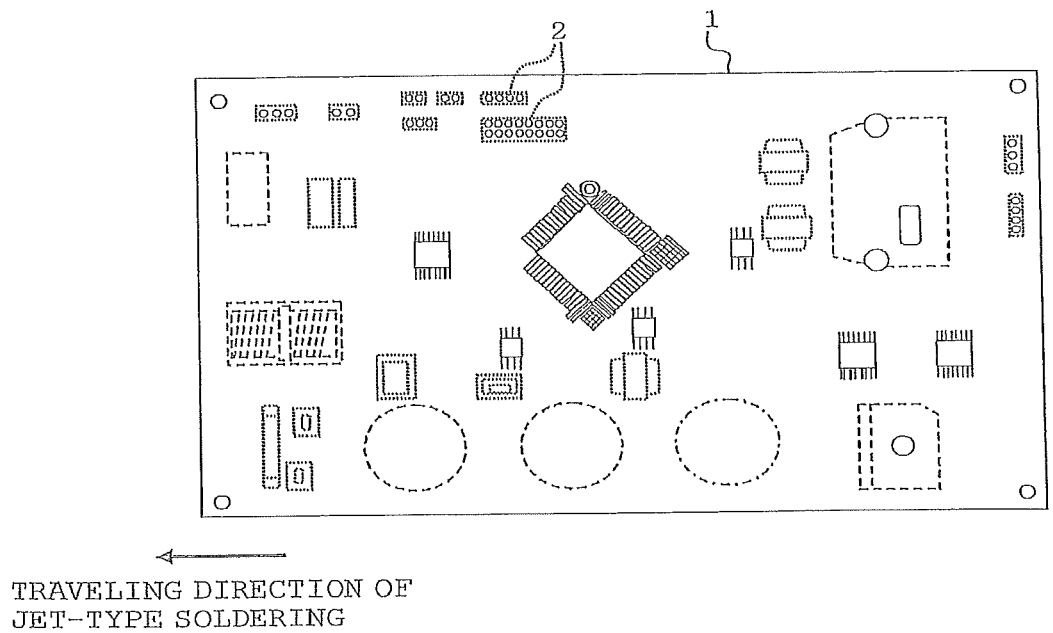
FIG. 1 is a plan view showing a rough layout configuration of a printed circuit board mounted with a dual inline lead-type electronic-part according to Embodiment 1 of the invention when viewed from the back side.
Figure 2:
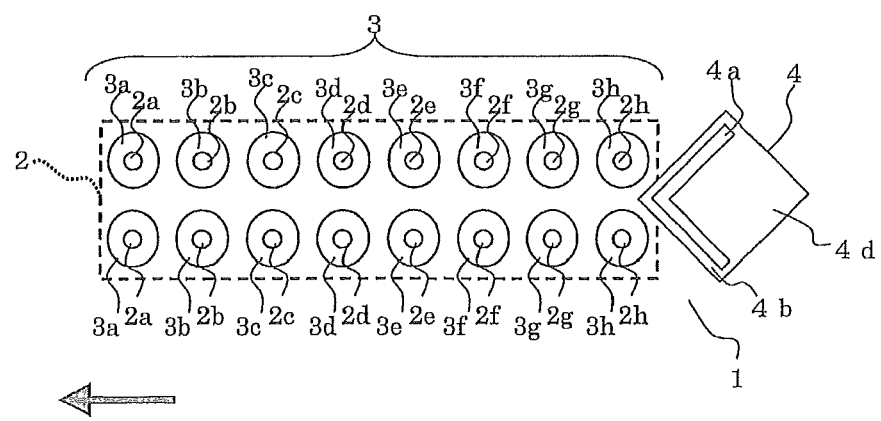
FIG. 2 is an enlarged plan view illustrating the arrangement relationship between a soldering land group of a dual inline lead-type electronic part and a solder-drawing land on the backside of the printed circuit board illustrated in FIG. 1.
Figure 3:
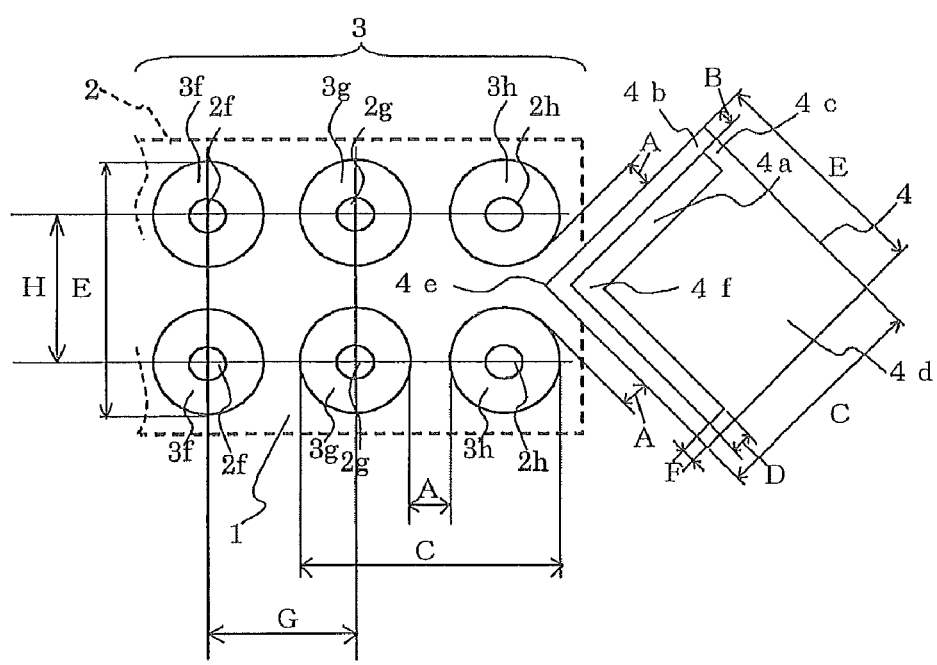
FIG. 3 is an enlarged plan view illustrating the dimensional relationship between the soldering lands on the rearmost position of the dual inline lead-type electronic part and the solder-drawing land illustrated in FIG. 2.
Figure 4:
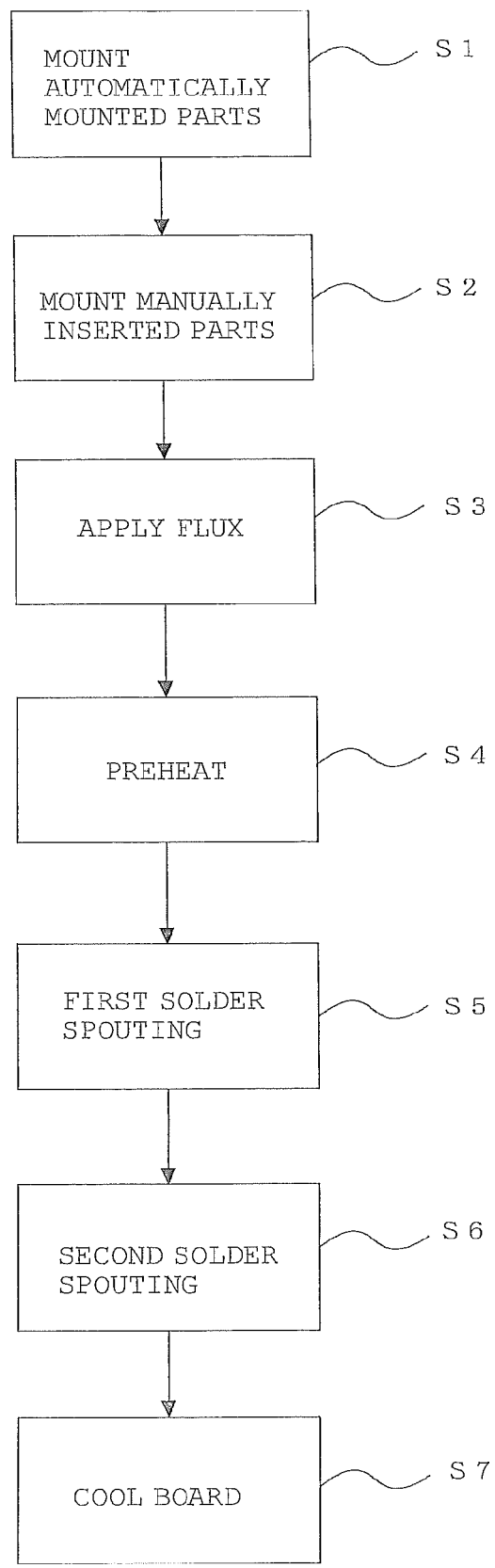
FIG. 4 is a flowchart showing a process of jet-type soldering operation for soldering the dual inline lead-type electronic part to a printed circuit board according to Embodiment 1 of the present invention.

FIG. 1 is a schematic plan view of the configuration of a printed circuit board mounted with a dual inline lead-type electronic-part according to Embodiment 1 of the invention when viewed from the backside thereof. FIG. 2 is an enlarged plan view illustrating the arrangement relationship between a soldering land group of a dual inline lead-type electronic part and a solder-drawing land on the backside of the printed circuit board illustrated in FIG. 1. FIG. 3 is an enlarged plan view illustrating the dimensional relationship between the soldering lands on the rearmost position of the dual inline lead-type electronic part and the solder-drawing land illustrated in FIG. 2. FIG. 4 is a flowchart showing a process of jet-type soldering operation for soldering the dual inline lead-type electronic part to a printed circuit board.

In the drawing, a printed circuit board 1 which is a printed circuit board mounted with a dual inline lead-type electronic-part includes parts to be mounted automatically (for example, a chip part resistance, a chip part capacitor, a chip part diode, a discrete resistance, a discrete capacitor, a discrete diode, and so on) (none of these parts are shown in the drawing) and parts to be inserted manually (for example, a large-capacity resistance, a hybrid IC, a transformer, a coil, a large-capacity semiconductor, a large capacitor, and so on) (none of these parts are shown in the drawing), these parts being disposed on a front surface of the printed circuit board 1.

Here, in an example shown in FIG. 1, copper foil (not shown) is provided on the backside of a printed circuit board 1 and a dual inline lead-type electronic part 2 is mounted thereon and arranged in the direction along an arrow in FIG. 1, i.e. in a traveling direction of jet-type soldering.

Referring now to FIG. 2 and FIG. 3, an example of the configuration of the soldering portion and the solder-drawing portion of the printed circuit board 1 for mounting the dual inline lead-type electronic part 2 will be described in detail. The present embodiment describes an example in which the dual inline lead-type electronic part 2 includes 16 lead terminals (leads 2a to 2h) which are arranged in dual lines each having eight leads. In addition, soldering lands 3a to 3h connected with the respective leads by soldering are disposed in two rows on the backside of the printed circuit board 1. A soldering land group 3 including soldering lands 3a to 3h is longitudinally arranged in parallel with the traveling direction of jet-type soldering. Here, soldering lands at the rearmost position of the soldering land group 3 in the travelling direction of the jet-type soldering are represented by a reference numeral "3h" and the rearmost leads are represented by a reference numeral "2h".

The printed circuit board 1 is provided with a solder-drawing land (rear solder-drawing land) 4 which is located at a position behind the rearmost soldering lands 3h. The solder-drawing land 4 is responsible for adhesion and absorption of excessive solder during soldering and outlined in a square shape. In addition, the inside of the solder-drawing land 4 is provided with a slit 4a formed in a bent shape. Furthermore, one corner 4e of the square-shaped portion is located near the rearmost soldering lands 3h, 3h and arranged between the leads 2h, 2h. That is, the profile of the solder-drawing land 4 is a square with 45-degree slant. In addition, a bent portion 4f of the slit 4a is arranged near the corner 4e. The slit 4a is formed in parallel with the respective two sides of the square, which are located forward in the traveling direction. The slit 4a is formed and bent into an angle bracket shape, and located at the front portion. Thus, the square (or rhombus) portion of the solder-drawing land 4 can be divided into an anterior solder-drawing portion 4b with a small area and a posterior solder-drawing portion 4d with a large area. The anterior solder-drawing portion 4b and the posterior solder-drawing portion 4d are connected to each other through thin-connecting portions 4c located at the respective ends of the slit 4a. Here, in the solder-drawing land 4, the slit 4a corresponds to an area of no copper foil on the printed circuit board 1. In contrast, the remainder including the anterior solder-drawing portion 4b, the posterior solder-drawing portion 4d, and the connecting portion 4c corresponds to an area with copper foil for absorbing excessive solder. In addition, the slit 4a can be formed by patterning into a predetermined shape and removing the copper foil portion by etching.

Referring now to FIG. 3, the relationship between the soldering land group 3 and the solder-drawing land 4 with respect to their arrangements and dimensions will be described. The solder-drawing land 4 is located at a position behind the rearmost soldering lands 3h and inclined 45 degrees and one corner 4e of the outline thereof is arranged adjacently to the space between the leads 2h, 2h of the respective rearmost soldering lands 3h, 3h. If the distance (space) between the adjacent soldering lands 3a to 3h is defined as "A", the distance (space) between the rearmost soldering lands 3h, 3h and the respective anterior sides of the outline of the solder-drawing land 4 is defined as almost equal to the distance A. In addition, the outline of the solder-drawing land 4 is formed into a square shape having external dimensions with a surface area substantially equal to a surface area obtained by multiplying the dimension C corresponding to a length of two laterally arranged soldering lands in the soldering land group 3 by the dimension E corresponding to a length of two longitudinally arranged soldering lands of the same.

As an example of dimensions, the width B of each anterior solder-drawing portion is 0.5 mm. The width D of each end of the slit 4a in the widthwise direction thereof is 1.0 mm, and the width F of each of the connecting portions 4C formed at the respective ends of the slit 4a is 0.5 mm. In addition, the distance G between the adjacent leads and the distance H between the lead lines are approximately 2 to 3 mm in the dual inline lead-type electronic part 2.

Subsequently, a procedure of soldering the dual inline lead-type electronic part 2 will be described with reference to a flowchart illustrated in FIG. 4. FIG. 4 illustrates the procedures for soldering the dual inline lead-type electronic part 2 to the printed circuit board 1 configured as described above, using a jet-type solder bath (not shown). First, the parts to be mounted automatically (for example, a chip part resistance, a chip part capacitor, a chip part diode, a discrete resistance, a discrete capacitor, a discrete diode, and so on) (not shown in the drawing) and an automatic-mounting-compatible dual inline lead-type electronic part 2 are mounted on a front surface and a back surface of the printed circuit board 1 by an automatic mounting machine at Step S1 for a process of mounting parts by the automatic mounting machine. Subsequently, at Step S2 for a process of mounting parts to be manually inserted, the parts to be manually inserted (for example, a large-capacity resistance, a hybrid IC, a transformer, a coil, a large-capacity semiconductor, a large capacitor, and so on) and manual-mounting-compatible lead-type electronic parts are manually inserted and mounted. Subsequently, at Step S3 for a flux application process, flux activator for fitting solder to the copper foil is applied to the back surface of the printed circuit board 1. Then, at Step S4 for a preheating process, the flux applied at Step S3 is heated so as to reach an optimal active temperature.

Subsequently, at Step S5 for a first solder spouting process, solder is applied all over to the lead portions of the parts on the back surface of the printed circuit board 1 where the dual inline lead-type electronic part 2 is mounted, from solder spouting means (not shown) for spouting solder as water from a fountain through a nozzle formed with a number of holes. When the first solder spouting process of Step S5 is ended, at Step S6 for a second solder spouting process, solder bridges formed between the leads such as the leads $2a$ to $2h$ of the dual inline lead-type electronic parts 2 during the first solder spouting process are removed by allowing the printed circuit board 1 to pass on the flat solder liquid surface in the solder bath in the direction indicated by the arrow in FIG. 1. Finally, the soldered printed circuit board 1 mounted with a dual inline lead-type electronic part is cooled at Step S7 for a board cooling process, so that the operation is ended.

Next, the action and effects of solder-drawing of the rear solder-drawing land 4 provided adjacently to the soldering land group 3 on the rear side with respect to the traveling direction of the jet-type soldering will be described. The dual inline lead-type electronic part 2 is mounted and arranged on the printed circuit board 1 in such a manner that the longitudinal side of the dual inline lead-type electronic part 2 is oriented in parallel with the traveling direction of the jet-type soldering as shown in FIG. 2. When the printed circuit board 1 enters a solder spouting portion in the jet-type solder bath, the solder flows rearward along the respective consecutive soldering lands $3a$ to $3h$ of the soldering land group 3 of the dual inline lead-type electronic part 2. At this time, the solder moves rearward while forming bridges in sequence by an action of surface/interfacial tension acting on the respective leads $2a$ to $2h$ of the dual inline lead-type electronic part 2. The solder moved rearward of the continuous soldering land group 3 is drawn by the rear solder-drawing land 4 arranged adjacently to the rearmost soldering lands $3h$. At that time, a force to cause the solder, which has once been drawn to the rear solder-drawing land 4 by the action of the surface/interfacial tension, to return to the soldering lands $3h$ acts.

Here, the rear solder-drawing land 4 proposed in Embodiment 1 is arranged so as to be spaced from the rearmost soldering lands $3h$ at a distance, which is substantially the same as the distance A between the respective soldering lands $3a$ to $3h$ of the soldering land group 3. In addition, a square outline of the rear solder-drawing land 4 is inclined at an angle of 45 degrees. In addition, the outline of the solder-drawing land 4 is formed into a square shape having external dimensions with a surface area substantially equal to a surface area obtained by multiplying the dimension C corresponding to a length of two laterally arranged soldering lands in the soldering land group 3 by the dimension E corresponding to a length of two longitudinally arranged soldering lands of the same. In addition, the angle bracket-shaped bent portion $4f$ of the slit $4a$ is arranged adjacent to the corner $4e$. Thus, the square portion of the solder-drawing portion 4 is divided into an anterior solder-drawing portion $4b$ and a posterior solder-drawing portion $4d$. The rear solder-drawing land 4 is placed adjacent to the rearmost soldering lands $3h$. The profile and arrangement of such a rear solder-drawing land 4 facilitates drawing of the solder from the soldering land group 3 to the rear solder-drawing land 4 and, in addition, the surface/interfacial tension of the solder drawn once on the rear solder-drawing land 4 is dispersed so that the force to cause the solder to return to the soldering lands $3h$ adjacent to the front thereof is reduced. In other words, the solder having been drawn from the soldering land group 3 to the solder-drawing land 4 smoothly spreads into the anterior solder-drawing portion $4b$ and the posterior solder-drawing portion $4d$ of the solder-drawing land 4, which are divided by the slit $4a$. In addition, the surface/interfacial tension of the solder on the solder-drawing land 4 is dispersed by the slit $4a$, so that the force to cause the solder to return to the soldering lands $3h$ adjacent to the front of the solder-drawing land 4 is reduced. Consequently, the solder bridges between the leads $2a$ to $2h$ in the soldering land group 3 are significantly reduced. The present inventor has confirmed that the arrangement of the rear solder-drawing land 4 inclined at an angle of 45 degrees can be effective against a solder bridge in a 2.5-mm pitch dual inline lead-type electronic part with a large amount of bridged solder.

Furthermore, the rear solder-drawing land 4 having the slit $4a$ formed near the rearmost soldering lands $3h$ is provided with a connecting portion $4c$ with thin copper foil remained on two portions at the respective ends of the slit $4a$. Thus, the solder having been drawn into the rear solder-drawing land 4 is caused to adjust the amount of solder on each of the anterior solder drawing portion $4b$ and the posterior solder drawing portion $4d$ by the connecting portion $4c$ formed of thin copper film. Therefore, from experimental evaluation results, the effects of the above configuration of the embodiment, in which the foams in the solder can be prevented from being generated at the time when the solder is dispersed, and generation of the solder chips after soldering can be eliminated, has been confirmed. Thus, the connecting portions $4c$ allow the solder once drawn into the anterior solder-drawing portion $4b$ and the posterior solder-drawing portion $4d$ of the solder-drawing land 4 to be smoothly dispersed through the connecting portions $4c$. In addition, the solder flows smoothly from the posterior solder-drawing portion $4d$ where much solder exists to the anterior solder-drawing portion $4b$ where less solder exists, through the connecting portions $4c$. The amount of the solder is adjusted smoothly so as to prevent unevenness of the amount of the solder on the respective portions of the solder-drawing land 4. Thus, the surface/interfacial tension of the solder on the solder-drawing land 4 is smoothly dispersed and hence the force to cause the solder to return to the adjacent soldering lands $3h$ is further reduced. Therefore, the foams in the solder are prevented from being generated when the solder is dispersed on the solder-drawing land 4, and generation of the solder chips after soldering is eliminated. As a result, it is effective for significantly reducing the finishing work such as manually removing the solder chips in the post process and improving the operating efficiency.

The verification proves that when the rear solder-drawing land 4 formed with the slit 4a and inclined 45 degrees is not provided and only the shape of the group of the soldering lands is changed, or when a flat vacant land corresponding to the soldering land group is provided, the occurrence of solder short circuits (bridges) generated in the soldering land group is significantly increased, the amount of generated solder chips due to the foams in the solder is also large, and especially in the case of the dual inline lead-type electronic part, these phenomena are obvious, in comparison with the case of this embodiment of the invention.

As described above, the printed circuit board 1 mounted with a dual inline lead-type electronic part of the embodiment can reduce the occurrence of the solder short circuits (bridges), which occur at the time when the solder moves rearward while forming bridges by the surface/interfacial tension during soldering the dual inline lead-type electronic part 2 using the jet-type solder bath. Also, the above circuit board 1 can reduce the amount of the solder chips generated due to the foams generated during soldering. Furthermore, an effect to reduce the locations capable of making the solder short circuits can be obtained.

In the printed circuit board 1 mounted with a dual inline lead-type electronic part of this embodiment, as described above, the dual inline lead-type electronic part 2 mounted on the printed circuit board 1 of this embodiment is arranged in parallel to the traveling direction of the jet-type soldering. In this case, the square-shaped solder-drawing land 4 formed with the bent slit 4a is provided adjacently to the rearmost soldering lands 3h of the continuous soldering land group 3 and inclined 45 degrees. In addition, the solder-drawing land 4 has the connecting portions 4c formed of thin copper foil being left at the respective ends of the slit 4a. Therefore, the generation of the solder bridges or the solder chips on the soldering land group 3 for the dual inline lead-type electronic part 2 can be prevented. In a soldering method of the dual inline lead-type electronic part 2 to be mounted on the printed circuit board 1 according to this embodiment, since the surface/interfacial tension of the solder once drawn on the rear solder-drawing land 4 is dispersed, the force to cause the solder to return to the soldering lands 3h is reduced. Consequently, the solder bridges between the soldering lands 3a to 3h in the respective lines can be significantly reduced, and an effect to improve the operating efficiency is achieved without increasing the manual finishing work in the post process. Furthermore, the connecting potions 4c formed of thin copper foil are left at the respective ends of the slit 4a. Hence, the solder drawn onto the rear solder-drawing land 4 is dispersed evenly on the anterior solder-drawing portion 4b and the posterior solder-drawing portion 4d on the solder-drawing land 4. In addition, the amount of the solder on the respective portions of the solder-drawing land 4 is adjusted by the connecting portions 4c formed of narrow copper foil portions. Thus, the foams in the solder are prevented from being generated when the solder is dispersed, and generation of the solder chips after soldering is eliminated. Therefore, it is effective for reducing the manual finishing work in the post process significantly and improving the operating efficiency.

As described above, generation of the solder bridges and the solder chips is effectively prevented. Therefore, even if the lead-free solder with inferior soldering adaptability, in which the solder bridges and the solder chips are easily produced because of relatively low flowability and relatively high surface tension, is used, generation of the solder bridges and the solder chips can be prevented, so that the environment friendly lead-free solder can be used and hence the environment friendly printed circuit board can be provided using the lead-free solder.

Figure 6:
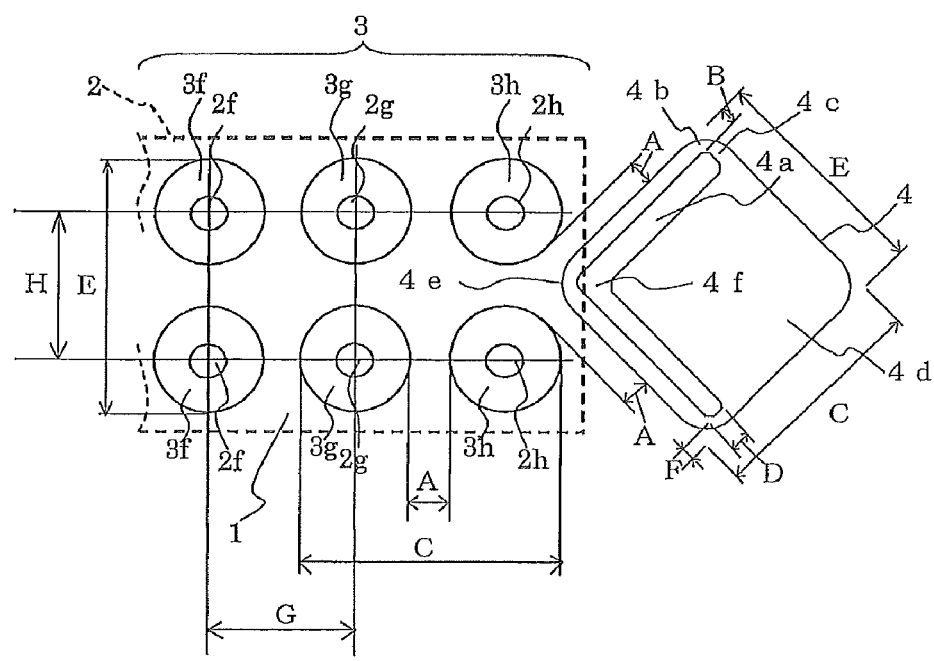
FIG. 6 is a schematic view illustrating another example of the shape of the solder-drawing land of the printed circuit board mounted with a dual inline lead-type electronic-part according to Embodiment 1 of the present invention.

Furthermore, the above embodiment has described that the generation of the solder bridges or the solder chips is suitably prevented by providing the solder-drawing land 4 for the soldering land group 3 having soldering lands 3a to 3h in dual lines. However, the number or the number of lines of the consecutive soldering lands 3a to 3h of the soldering land group 3 provided with the solder-drawing land 4 may be different within a range which can provide the effect to prevent generation of the solder bridges and the solder chips, depending on the shape or the like of the lead-type electronic part 2. The dimensions and the shapes of the rear solder-drawing land 4, the slit 4a thereon, the anterior solder-drawing portion 4b, the posterior solder-drawing portion 4d, and the connecting portions 4c in the above-described embodiment are exemplified only, and the invention is not limited thereto under the condition that the lead type is plural inline. They can be changed as needed by the conditions such as the size and shape of the soldering land group 3 or other parts within the range which can provide an effect to prevent generation of the solder bridges and the solder chips. Therefore, the inclined angle of the rear solder-drawing land 4 is not limited to 45 degrees. Alternatively, it may be more than 45 degrees. In addition, the slit 4a may be curved into an arc shape. Furthermore, the corner portions of the solder-drawing land 4 may have a curved line like the one in an embodiment illustrated in FIG. 6.

Figure 5:
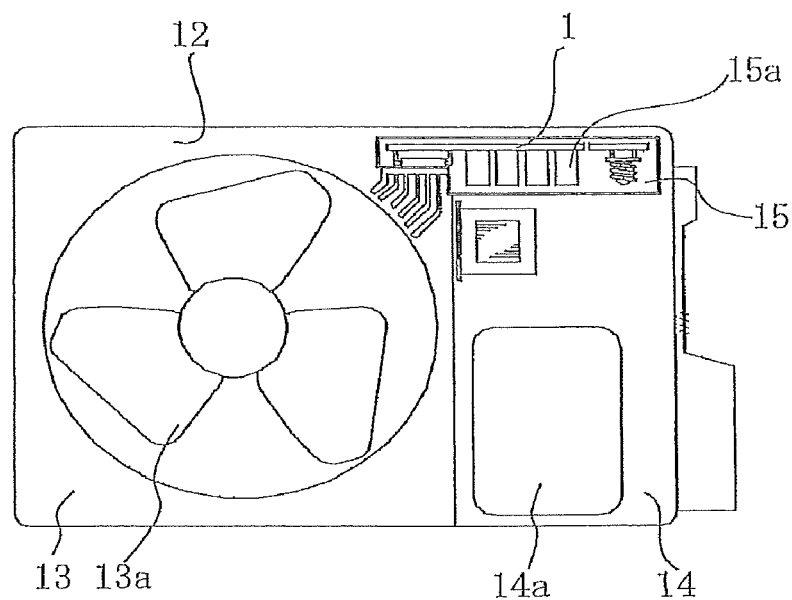
FIG. 5 is a schematic front view of an air-conditioner provided with the printed circuit board mounted with a dual inline lead-type electronic-part according to Embodiment 1 of the invention.

Subsequently, an example of usage of the printed circuit board 1 described above will be described. FIG. 5 is a schematic front view of an outdoor unit of an air-conditioner provided with the printed circuit board 1 mounted with a dual inline lead-type electronic part according to Embodiment 1 of the invention. In the drawing, the outdoor unit 12 of the air-conditioner includes an air-blower chamber 13 equipped with an air blower 13a, and a compressor chamber 14 including a compressor 14a and a flat-shaped electric part box 15. The electric part box 15 contains the printed circuit board 1 mounted with a dual inline lead-type electronic part which is installed therein so that its front surface, on which electric parts 15a are mounted, faces downward, and its flat-shaped back surface having the copper foil faces upward.

Therefore, the electric part box 15, in which the printed circuit board 1 mounted with a dual inline lead-type electronic part is installed, can be formed into a flat shape in the height direction to reduce an installation space. Thus, the electric part box 15 in the compressor chamber 14 of the outdoor unit 12 of the air-conditioner is flattened to reduce an arrangement space, so that flexibility in space for placing in other parts is increased. Therefore, the assembly is advantageously performed with a sufficient space. The quality of the air-conditioner is advantageously improved with the provision of the printed circuit board 1 mounted with a dual inline lead-type electronic part 2 in which generation of the solder bridges and the solder chips is prevented.

In this manner, the printed circuit board 1 mounted with a dual inline lead-type electronic part according to the embodiment of the invention includes soldering lands 3a to 3h for connecting the respective leads 2a to 2h of a dual inline lead-type electronic part 2 by jet-type soldering; and a solder-drawing land 4 for absorbing excessive solder during soldering, which is arranged at a position behind the rearmost soldering lands 3h in the travelling direction of jet-type soldering. Here, the solder-drawing land 4 is square-shaped and has the slit 4a formed inside in a bent shape. One corner 4e of the square-shape is located near the rearmost soldering lands 3h, 3h and arranged between the leads 2h, 2h, while the bent portion 4f of the slit 4a is arranged near the one corner 4e. Therefore, the shape of the solder-drawing land 4 can be simplified. In addition, the arrangement of the solder-drawing land 4 can advantageously prevent the generation of the solder bridges between the leads or the solder chips on the soldering land group 3.

Since the solder-drawing land 4 is provided with the slit 4a and the connecting portions 4c formed by leaving the copper foil at the ends of the slit 4a, a force to cause the solder to return from the solder-drawing land 4 to the adjacent soldering lands 3h is reduced. Thus, generation of the soldering bridges can be prevented. In addition, the solder foams are not generated on the solder-drawing land 4, so that generation of the solder chips after soldering can be advantageously prevented.

In addition, since the lead-free solder is used to solder the dual inline lead-type electronic part 2, the environment friendly printed circuit board is advantageously obtained.

The method of soldering the dual inline lead-type electronic part 2 according to the embodiment described above is the soldering method to solder each of leads 2a to 2h of the dual inline lead-type electronic part 2 to the respective soldering lands 3a to 3h arranged on the printed circuit board 1 by jet-type soldering. The printed circuit board 1 includes the rear solder-drawing land 4 having a square outer shape and a slit 4a formed inside in a bent shape, one corner 4e of the square shape is located near the rearmost soldering lands 3h and arranged between leads 2h, 2h, and the bent portion 4f of the slit 4a is arranged near the one corner 4e. The method includes: a step for mounting the dual inline lead-type electronic part 2 on the printed circuit board 1; a step for applying flux activator on the printed circuit board 1 on which the dual inline lead-type electronic part 2 has been mounted in the mounting step; a step for preheating for heating the flux activator to the active temperature; the step of first solder spouting for spouting solder all over the portions of the leads 2a to 2h of the dual inline lead-type electronic part 2 arranged on the printed circuit board 1, and the step of second solder spouting for removing the solder bridges formed between the leads of the dual inline lead-type electronic part 2 during the first solder spouting step by making the solder bridges adhere to the rear solder-drawing land 4. Therefore, the surface/interfacial tension of the solder once drawn on the solder-drawing land 4 can be dispersed to reduce the force to return to the soldering lands 3h. Consequently, generation of the solder bridges between the leads and the solder chips on the soldering land group 3 can be reduced significantly, and the effect to improve the operating efficiency is achieved without increasing the manual finishing work in the post process.

In the air-conditioner provided with the printed circuit board mounted with a dual inline lead-type electronic part according to the embodiment described above, the outdoor unit 12 of the air-conditioner including the air-blower chamber 13 and the compressor chamber 14 is configured in such a manner that the electric part box 15 arranged at the upper part of the compressor chamber 14 is formed into a flat shape, the printed circuit board 1, on which the lead-type electronic part 2 is mounted by soldering using the jet-type solder bath, is installed in the electric part box 15, the printed circuit board 1 is provided with the solder-drawing land 4 which has a slit 4a and is inclined 45 degrees and positioned behind the rearmost portion of the continuous soldering land group 3 of the dual inline lead-type electronic part 2 arranged in parallel with the travelling direction of jet-type soldering, and the connecting portions 4c are formed by leaving thin copper foil at the ends of the slit 4a. Therefore, the quality of the air-conditioner is advantageously improved with the provision of the printed circuit board mounted with a dual inline lead-type electronic part in which generation of the solder bridges between the leads and the solder chips formed on the soldering land group 3 is prevented. In addition, the electric part box 15 in the compressor chamber 14 of the outdoor unit 12 of the air-conditioner is formed into a flat shape to reduce an installation space. Thus, the flexibility in space for placing in other parts is increased. Therefore, the assembly is advantageously performed with a sufficient space.

EXPLANATION OF SIGNS 1 printed circuit, 2 dual inline lead-type electronic part, 2a-2h lead, 3 soldering land group, 3a-3h soldering land, 3h rearmost soldering land, 4 rear solder-drawing land, 4a slit, 4b anterior solder-drawing portion, 4c connecting portion, 4d posterior solder-drawing portion, 4e one corner of square outer shape, 4f bent portion of slit, 12 outdoor unit of air conditioner, 13 air-blower chamber, 14 compressor chamber, 15 electric part box.

What is claimed is:

1. A printed circuit board mounted with a dual inline lead-type part, comprising:
   a plurality of soldering lands for connecting respective leads of the dual inline lead-type part by jet-type soldering, the soldering lands and respective leads longitudinally arranged in two rows in parallel with a travelling direction of the jet-type soldering; and
   a solder-drawing land for absorbing excess solder during soldering, which is arranged at a position behind rearmost soldering lands in the traveling direction of jet-type soldering, wherein
   the solder-drawing land has a square outer shape and a slit in a bent shape therein,
   one corner of the square outer shape is located near the rearmost soldering lands and arranged between the rearmost leads, while a bent portion of the slit is arranged near the one corner,
   the solder-drawing land having a square shape with a surface area substantially equal to a surface area obtained by multiplying a length of two laterally arranged soldering lands by a length of two longitudinally arranged adjacent soldering lands, and the outline of the square shape is arranged so as to be inclined 45 degrees, to the travelling direction, and
   the solder-drawing land includes an anterior solder-drawing portion and a posterior solder-drawing portion that is obtained by dividing the solder-drawing land by the slit into a front and a rear portions, the posterior solder-drawing portion having a surface area larger than a surface area of the anterior solder drawing portion, ends of the slit provided with connecting portions for connecting the anterior solder drawing portion with the posterior solder drawing portion, and a width of the anterior solder drawing portion and the connecting portions is the same.

2. The printed circuit board mounted with the dual inline lead-type part of claim 1, wherein
   the dual inline lead-type part having a lead distance of 2 mm to 3 mm is mounted.

3. The printed circuit board mounted with the dual inline lead-type part of claim 1, wherein
   the dual inline lead-type part is soldered using lead-free solder.

4. An air-conditioner, wherein
an electric part box, in which the printed circuit board mounted with the dual inline lead-type part according to claim 1 is stored, is arranged above a compressor in a compressor chamber.

5. A printed circuit board for mounting a dual inline lead-type part, comprising:
- a plurality of soldering lands for connecting with respective leads of the dual inline lead-type part by jet-type soldering, the soldering lands each having an insertion portion for inserting a lead of the part and the soldering lands and insertion portions longitudinally arranged in two rows in parallel with a travelling direction of the jet-type soldering; and
- a solder-drawing land for absorbing excess solder during soldering, which is arranged at a position behind rearmost soldering lands in the traveling direction of jet-type soldering; wherein
- the solder-drawing land has a square outer shape and a slit in a bent shape therein,
- one corner of the square outer shape is located near the rearmost soldering lands and arranged between the rearmost insertion portions, while a bent portion of the slit is arranged near the one corner,
- the solder-drawing land having a square shape with a surface area substantially equal to a surface area obtained by multiplying a length of two laterally arranged soldering lands by a length of two longitudinally arranged adjacent soldering lands, and the outline of the square shape is arranged so as to be inclined 45 degrees, to the travelling direction, and
- the solder-drawing land includes an anterior solder drawing portion and a posterior solder-drawing portion obtained by dividing the solder-drawing land by the slit into a front and a rear portions, the posterior solder-drawing portion having a surface area larger than a surface area of the anterior solder drawing portion, the ends of the slit provided with connecting portions for connecting the anterior solder drawing portion with the posterior solder drawing portion, and a width of the anterior solder drawing portion and the connecting portions is the same.

* * * * *